US009461235B2

(12) United States Patent
Fujita et al.

(10) Patent No.: US 9,461,235 B2
(45) Date of Patent: Oct. 4, 2016

(54) ELASTIC WAVE DEVICE AND METHOD OF MANUFACTURING THE DEVICE

(71) Applicant: SKYWORKS FILTER SOLUTIONS JAPAN CO., LTD., Kadoma-Shi (JP)

(72) Inventors: Tomohiro Fujita, Osaka-Fu (JP); Kenichi Matsushima, Hyogo-Ken (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 422 days.

(21) Appl. No.: 13/984,007

(22) PCT Filed: Feb. 14, 2013

(86) PCT No.: PCT/JP2013/000802
§ 371 (c)(1),
(2) Date: Aug. 6, 2013

(87) PCT Pub. No.: WO2013/128823
PCT Pub. Date: Sep. 6, 2013

(65) Prior Publication Data
US 2014/0125197 A1    May 8, 2014

(30) Foreign Application Priority Data

Feb. 28, 2012  (JP) ................................. 2012-041644

(51) Int. Cl.
*H01L 41/047* (2006.01)
*H03H 9/10* (2006.01)

(52) U.S. Cl.
CPC ........ *H01L 41/0477* (2013.01); *H03H 9/1092* (2013.01)

(58) Field of Classification Search
CPC ............. H01L 41/0477; H01L 41/047; H01L 41/0926; H03H 9/1092; H03H 9/131
USPC ............................. 310/313 A, 344, 363, 364
See application file for complete search history.

(56) References Cited

U.S. PATENT DOCUMENTS 7,101,026 B2 *  9/2006  Shimada .............. B41J 2/14233
                                                  347/68
7,439,658 B2 * 10/2008  Aratake ............... H03H 9/1021
                                                  310/344

(Continued)

FOREIGN PATENT DOCUMENTS

CN     101047170 A    10/2007
JP     2001-185976 A   7/2001

(Continued)

OTHER PUBLICATIONS

Copper characteristics from Jefferson Lab with Density.*
Platinum characteristics from Jefferson Lab with Density.*
Modulus of Tungsten and Molybdenum from The Elements.*
International Search Report issued in PCT/JP2013/000802 with mailing date of Apr. 23, 2013.

*Primary Examiner* — Shawki S Ismail
*Assistant Examiner* — Bryan Gordon
(74) *Attorney, Agent, or Firm* — Lando & Anastasi, LLP

(57) ABSTRACT

An elastic wave device includes a piezoelectric substrate, a comb-shaped electrode above an upper surface of the piezoelectric substrate, a wiring connected to the comb-shaped electrode, an element cover above the upper surface of the piezoelectric substrate for covering the comb-shaped electrode across a space, a first electrode above an upper surface of the element cover, a sealing resin above the upper surface of the piezoelectric substrate for covering the element cover and the first electrode, a terminal electrode above an upper surface of the sealing resin, and a second electrode passing through the sealing resin for electrically connecting the first electrode with the terminal electrode. The first and second electrodes are made of films produced by electro-plating. The diameter of plating particles of the first electrode may be larger than that of plating particles of the second electrode.

24 Claims, 5 Drawing Sheets

(56) References Cited

U.S. PATENT DOCUMENTS

| | | | |
|---|---|---|---|
| 7,602,102 B1 * | 10/2009 | Barber | H03H 3/02 310/320 |
| 7,875,481 B2 | 1/2011 | Onozuka et al. | |
| 2004/0207296 A1 * | 10/2004 | Namerikawa | H01L 41/0831 310/367 |
| 2007/0252481 A1 * | 11/2007 | Iwamoto | H03H 9/0576 310/344 |
| 2009/0001849 A1 | 1/2009 | Tsuda | |
| 2010/0225202 A1 | 9/2010 | Fukano et al. | |
| 2011/0084573 A1 * | 4/2011 | Yamaji | H03H 9/1092 310/340 |
| 2011/0115339 A1 * | 5/2011 | Makibuchi | H01L 23/10 310/340 |
| 2012/0031648 A1 | 2/2012 | Ebe | |

FOREIGN PATENT DOCUMENTS

| | | |
|---|---|---|
| JP | 2008-227748 A | 9/2008 |
| JP | 2009-010559 A | 1/2009 |
| JP | 2009-117730 A | 5/2009 |
| JP | 2009-267484 A | 11/2009 |
| JP | 2012038823 A | 2/2012 |
| WO | WO-2006/134928 A1 | 12/2006 |
| WO | WO-2009/057699 A1 | 5/2009 |
| WO | 2013128823 A1 | 9/2013 |

* cited by examiner

PRIOR ART FIG. 5
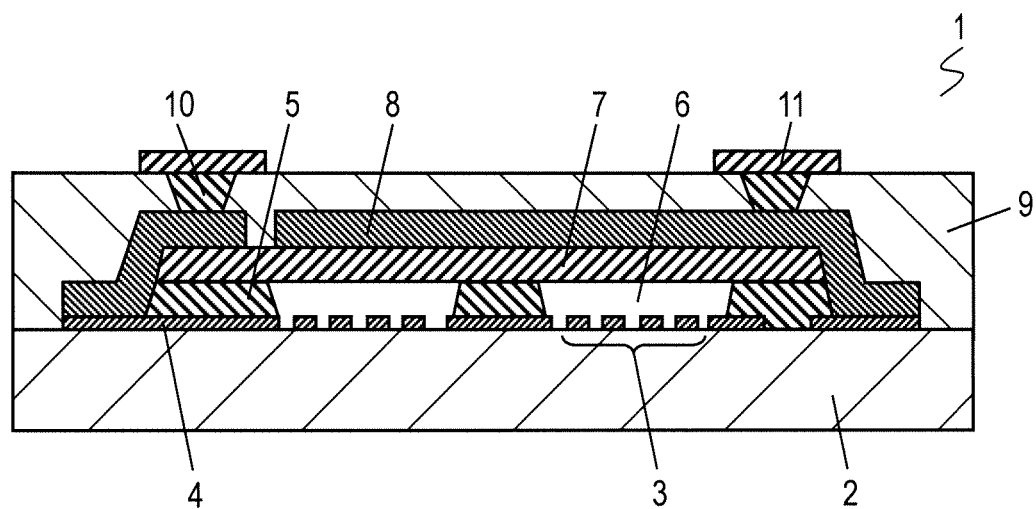

ELASTIC WAVE DEVICE AND METHOD OF MANUFACTURING THE DEVICE

RELATED APPLICATIONS

This application is the U.S. National Phase under 35 U.S.C. §371 of International Application No. PCT/JP2013/000802, filed on Feb. 14, 2013, which in turn claims the benefit of Japanese Application No. 2012-041644, filed on Feb. 28, 2012, the disclosures of which Applications are incorporated by reference herein.

TECHNICAL FIELD

The present invention relates to an elastic wave device and a method of manufacturing the device.

BACKGROUND ART

FIG. 5 is a cross sectional view of a conventional elastic wave device 1. The elastic wave device 1 includes piezoelectric substrate 2, comb-shaped electrode 3 disposed on piezoelectric substrate 2, wiring 4 disposed on piezoelectric substrate 2, side wall 5 surrounding comb-shaped electrode 3, covering part 7 disposed on an upper surface of side wall 5, electrode 8 disposed on covering part 7, sealing resin 9 sealing cover part 7 and electrode 8, electrode 10 passing through sealing resin 9, and terminal electrode 11 formed on an upper surface of electrode 10. Side wall 5 surrounds space 6 in which comb-shaped electrode 3 is excited. Covering part 7 covers space 6 from above the space.

A conventional elastic wave device similar to elastic wave device 1 is described in Patent Literature 1.

CITATION LIST

Patent Literature

Patent Literature 1: Japanese Patent Laid-Open Publication No. 2001-185976

SUMMARY OF THE INVENTION

An elastic wave device includes a piezoelectric substrate, a comb-shaped electrode provided above an upper surface of the piezoelectric substrate, a wiring connected to the comb-shaped electrode, an element cover provided above the upper surface of the piezoelectric substrate for covering the comb-shaped electrode across a space, a first electrode provided above an upper surface of the element cover, a sealing resin provided above the upper surface of the piezoelectric substrate for covering the element cover and the first electrode, a terminal electrode provided above an upper surface of the sealing resin, and a second electrode passing through the sealing resin for electrically connecting the first electrode with the terminal electrode.

In this elastic wave device, the first electrode and the second electrode may be made of a film produced by electro-plating. A diameter of plating particles of the first electrode may be larger than a diameter of plating particles of the second electrode.

The Young's modulus of the first electrode may be smaller than the Young's modulus of the second electrode.

The first electrode may be made of a film produced by matte copper plating, and the second electrode may be made of a film produced by bright copper plating.

An internal stress of the first electrode may be a tensile stress. An internal stress of the second electrode may be a compressive stress. The internal stress of the first electrode may be smaller than the internal stress of the second electrode.

The density of the first electrode is lower than the density of the second electrode.

BRIEF DESCRIPTION OF DRAWINGS

FIG. 5 is a cross sectional view of a conventional elastic wave device.

DETAIL DESCRIPTION OF PREFERRED EMBODIMENT

Figure 1:
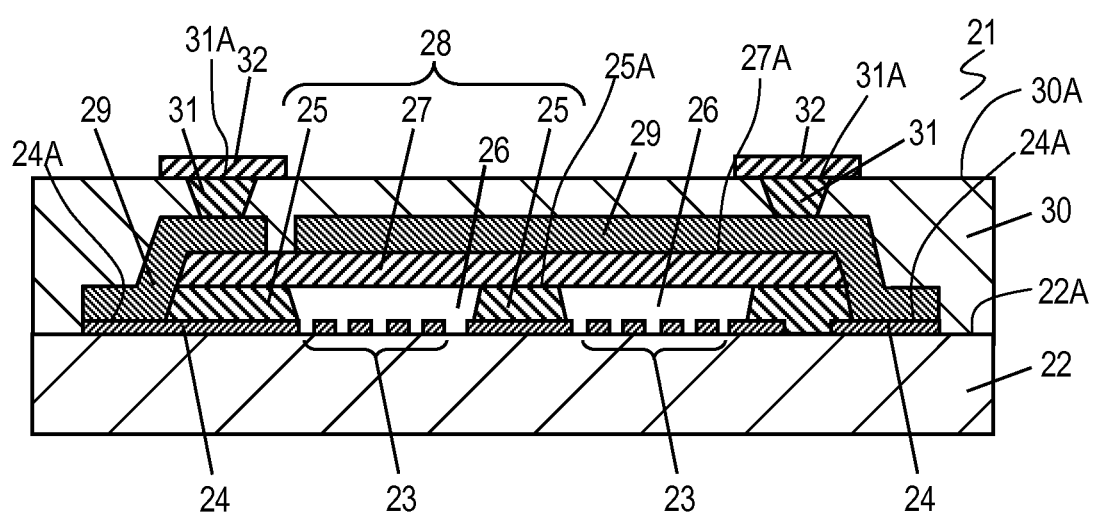
FIG. 1 is a cross sectional view of an elastic wave device according to an exemplary embodiment.

FIG. 1 is a cross sectional view of elastic wave device 21 according to an exemplary embodiment.

As shown in FIG. 1, elastic wave device 21 includes comb-shaped electrode 23 provided on and above upper surface 22A of piezoelectric substrate 22, wiring 24 provided on and above upper surface 22A of piezoelectric substrate 22, side wall 25 provided on upper surface 22A of piezoelectric substrate 22, covering part 27 provided on and above upper surface 25A of side wall 25, electrode 29 provided from upper surface 24A of wiring 24 to upper surface 27A of covering part 27, sealing resin 30 sealing covering part 27 and electrode 29 from above covering part 27 and electrode 29, electrode 31 passing through sealing resin 30, and terminal electrode 32 provided on and above upper surface 31A of electrode 31. Side wall 25 surrounds comb-shaped electrode 23 and constitutes space 26 in which comb-shaped electrode 23 is excited.

Piezoelectric substrate 22 is made of rotated Y-cut X-propagation single crystal lithium tantalite, having a thickness ranging from about 100 to 350 μm.

Comb-shaped electrode 23 is made of metal mainly containing aluminum and is provided on upper surface 22A of piezoelectric substrate 22. Upon a voltage being applied, comb-shaped electrode 23A excites a surface acoustic wave at upper surface 22A of piezoelectric substrate 22. A protective film made of dielectric material, such as silicon oxide, may be provided on a surface of comb-shaped electrode 23 if necessary.

Wiring 24 is a conductor provided on upper surface 22A of piezoelectric substrate 22, and is electrically connected to comb-shaped electrode 23.

Side wall 25 is formed by exposing and developing polyimide-based light curing resin.

Space 26 is provided above comb-shaped electrode 23 allowing a surface acoustic wave to be excited therein.

Covering part 27 covers space 26 from above space 26 for sealing space 26. Covering part 27 is formed by exposing and developing a polyimide-based light curing resin sheet attached onto upper surface 25A of side wall 25. Side wall 25 and covering part 27 constitute element cover 28 sealing comb-shaped electrode 23 and space 26.

Electrode 29 is made of a conductive film formed by matt electrolytic copper plating and provided from upper surface 24A of wiring 24 to upper surface 27A of covering part 27 through an outer side surface of side wall 25. The film constituting electrode 29 is formed by the electro-plating using a plating solution composed of 150 to 200 g/L of copper sulfate pentahydrate, 50 to 90 g/L of sulfuric acid, an appropriate amount of chloride ion, and an additive mainly made of a surface active agent. The diameter of plating particles ranges from 3 to 10 µm. The Young's modulus of the plating film ranges from 8 to 17 GPa. An internal stress of the plating film is a tensile stress ranging from about 10 to 20 MPa. Electrode 29 covers most of element cover 28 to provide a mechanical strength of element cover 28, effectively shielding comb-shaped electrode 23 and wiring 24, and thus restraining water to enter into space 26. Electrode 29 has a larger particle size, a rougher plating surface, a smaller Young's modulus, and a softer plating surface than electrode 31 formed by bright copper electrolytic plating. The internal stress of electrode 29 is a tensile stress smaller than an internal stress of electrode 31. The density of electrode 29 is lower than electrode 31.

Sealing resin 30 is provided on and above upper surface 22A of piezoelectric substrate 22 made of hardened epoxy-based resin containing filler, such as silica, and seals element cover 28 and electrode 29.

Electrode 31 is a via-electrode passing through sealing resin 30 and connecting electrode 29 with terminal electrode 32, and is made of a film formed by bright copper electrolytic plating. The bright electrolytic copper plating film constituting electrode 31 is obtained by the electroplating using a copper sulfate plating solution composed of 150 to 250 g/L of copper sulfate pentahydrate, 50 to 120 g/L sulfuric acid, an appropriate amount of chloride ion, an additive, such as polyethylene glycol, and a surface-active agent. Polyethylene glycol functions as a suppressive component in plating deposition, and prevents local concentration of a current, making deposited particle in copper plated film small. The surface-active agent reduces a surface tension of the plating solution, increasing wettability between an object to be plated and plating solution. The surface-active agent weakly controls plating and hardly controls the diameter of a deposited particle effectively. However, upon being used with polyethylene glycol, the surface-active agent can control the diameter of the particle while maintaining the wettability of the plating solution. The bright electrolytic copper plating film constituting electrode 31 has a compressive stress ranging from about 5 to 10 MPa as an internal stress. Electrode 31 has a smaller particle size, a brighter plating surface, larger Young's modulus, and a harder plating surface than electrode 29 formed by matte electrolytic copper plating. The internal stress of electrode 31 is a relatively higher compressive stress. Electrode 31 has a higher density and larger conductivity.

Terminal electrode 32 is provided on upper surface 31A of electrode 31 and on upper surface 30A of sealing resin 30 which surrounds the electrode for electrically connecting elastic wave device 21 to an external electronic circuit.

Elastic wave device 21 is called a wafer-level CSP, having a significantly small size identical to that of piezoelectric substrate 22 having the elastic wave element provided thereon.

In the conventional elastic wave device 1 shown in FIG. 5, piezoelectric substrate 2 may warp and break during a manufacturing process with an internal stress of electrode 8, reducing manufacturing yield.

In elastic wave device 21 according to the embodiment, a diameter of plating particles of electrode 29 is larger than a diameter of plating particles of electrode 31, allowing the plating film of electrode 29 to be softer than the plating film of electrode 31. The warping of piezoelectric substrate 22 and the breaking of piezoelectric substrate 22 caused by the warping are consequently reduced, improving manufacturing yield of elastic wave device 21.

As the diameter of the plating particle of electrode 29 increases, the surface of electrode 29 can be rougher. Resultantly, without specifically applying a roughing process to the surface of electrode 29, bonding strength is secured between electrode 29 and sealing resin electrode 30, reducing manufacturing processes while ensuring mechanical strength of elastic wave device 21.

In elastic wave device 21, the Young's modulus of electrode 29 is smaller than the Young's modulus of electrode 31, allowing the plating film of electrode 29 to be softer than the plating film of electrode 31. Warping of piezoelectric substrate 22 and breaking of piezoelectric substrate 22 caused by the warping of piezoelectric substrate 22 are therefore reduced, improving manufacturing yield of elastic wave device 21.

Further, in elastic wave device 21, an internal stress of electrode 29 is a tensile stress while an internal stress of electrode 31 is a reversely exerted compressive stress, hence cancelling the stresses each other and reducing a total stress applied to piezoelectric substrate 22. Resultantly, the warping caused with piezoelectric substrate 22 and the breaking caused by the warping are reduced, improving manufacturing yield of elastic wave device 21. Furthermore, since the internal stress of larger dimension electrode 29 which greatly affects the warping of piezoelectric substrate 22 is lower than an internal stress of small electrode 31 which less affects warping of piezoelectric substrate 22, hence reducing total stress applied to piezoelectric substrate 22 and further reducing the warping of piezoelectric substrate 22.

Further, in elastic wave device 21, the density of electrode 29 is small, and allows the film of electrode 29 to be soft. The stress of electrode 29 is therefore small and reduces warping of piezoelectric substrate 22, thus allowing the surface of electrode 29 to be roughened.

In elastic wave device 21, electrode 31 has a high density and is a fine film, and reduces a conductive resistance of the electrode. This reduces an influence of electrode 31 on electric performance of elastic wave device 21, and ensures a mechanical strength and connecting reliability as the via electrode. Moreover, electrode 31 generates a relatively strong compressive stress in a direction reverse to the stress of electrode 29, reducing the total stress applied to piezoelectric substrate 22.

In elastic wave device 21, electrode 29 is formed by matte electrolytic copper plating. The diameter of the plating particles of electrode 29 is large. The surface of electrode 29 is rough and the density of the film is low. Therefore, the Young's modulus of electrode 29 is small. The internal stress is low and is a tensile stress.

In elastic wave device 21, electrode 31 is formed by bright copper electrolytic plating. The particle size of the plating of electrode 31 is small and the density of the electrode is high. Thus, the surface of electrode 31 is bright. The Young's modulus of electrode 31 is large. An internal stress is relatively large and is compressive stress.

A method of manufacturing elastic wave device 21 will be described below. FIGS. 2A to 2C, 3A to 3C, and 4A to 4C are cross sectional views of elastic wave device 21 for schematically illustrating a method of manufacturing elastic wave device 21.

Figure 2A:
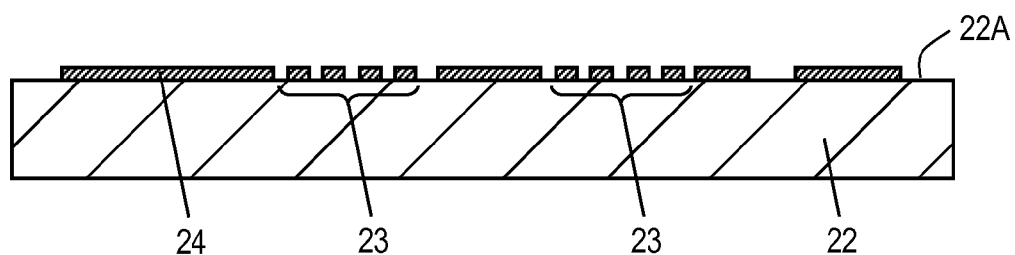
FIG. 2A is a cross sectional view of the elastic wave device according to the embodiment for illustrating a method of manufacturing the elastic wave device.

First, a metal thin film is formed on upper surface 22A of piezoelectric substrate 22, and is etched by a photolithographic technology, thereby forming plural comb-shaped electrode 23 and wiring 24, as shown in FIG. 2A.

Figure 2B:
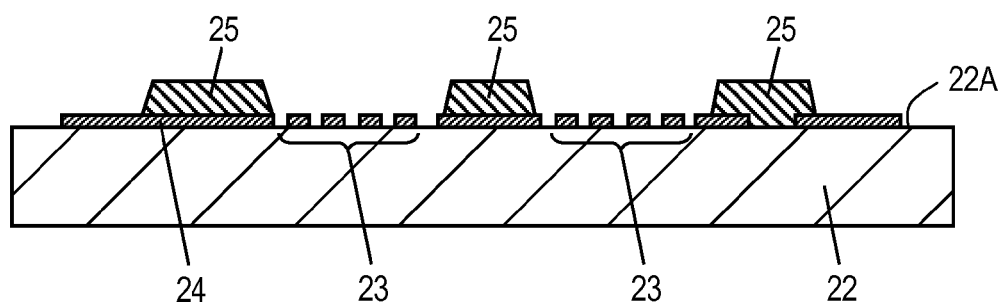
FIG. 2B is a cross sectional view of the elastic wave device according to the embodiment for illustrating the method of manufacturing the elastic wave device.

Then, a sheet made of polyimide-based light curing resin is placed on upper surface 22A of piezoelectric substrate 22. The sheet is exposed, developed, and hardened, thereby forming side wall 25 which surrounds comb-shaped electrode 23 and which constitutes space 26, as shown in FIG. 2B.

Figure 2C:
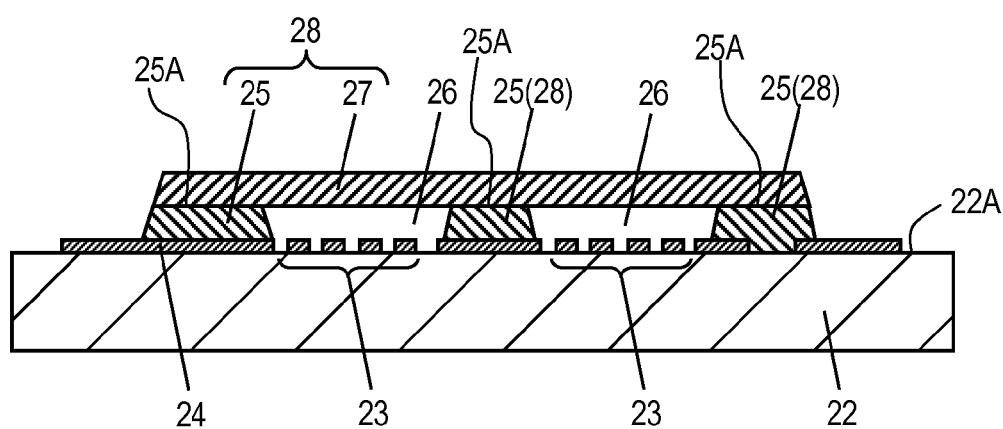
FIG. 2C is a cross sectional view of the elastic wave device according to the embodiment for illustrating the method of manufacturing the elastic wave device.

Then, a sheet made of polyimide-based light curing resin is placed on upper surface 25A of outside wall 25. The sheet is then exposed, developed and hardened, thereby forming covering part 27 covering space 26 from above in which comb-shaped electrode 23 is excited. Side wall 25 and covering part 27 constitute element cover 28, as shown in FIG. 2C.

Figure 3A:
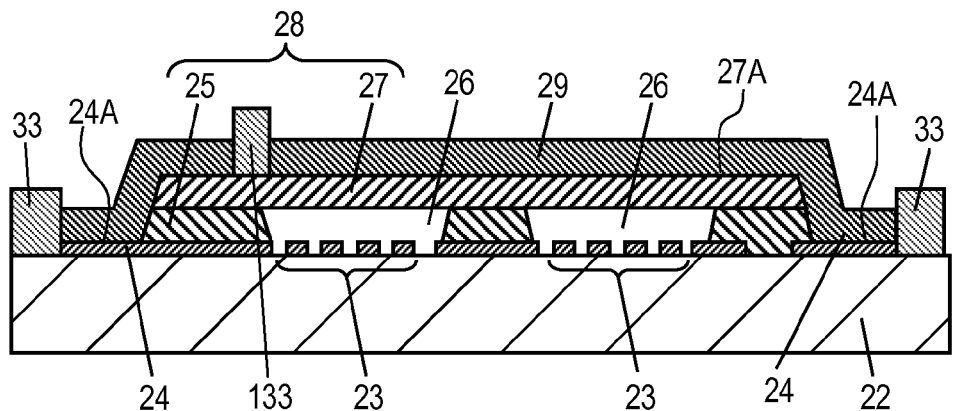
FIG. 3A is a cross sectional view of the elastic wave device according to the embodiment for illustrating the method of manufacturing the elastic wave device.

Next, a feeding conductor for electrolytic copper plating is formed. Plating resist 33 is formed on upper surface 22A of piezoelectric substrate 22. Plating resist 133 is formed on upper surface 27A of covering part 27. Then, electrode 29 covering upper surface 24A of wiring 24 through side wall 25 to upper surface 27A of covering part 27 is formed by matte electrolytic copper plating, as shown in FIG. 3A. Plating resist 133 prevents wiring 24 to short-circuit through electrode 29.

Figure 3B:
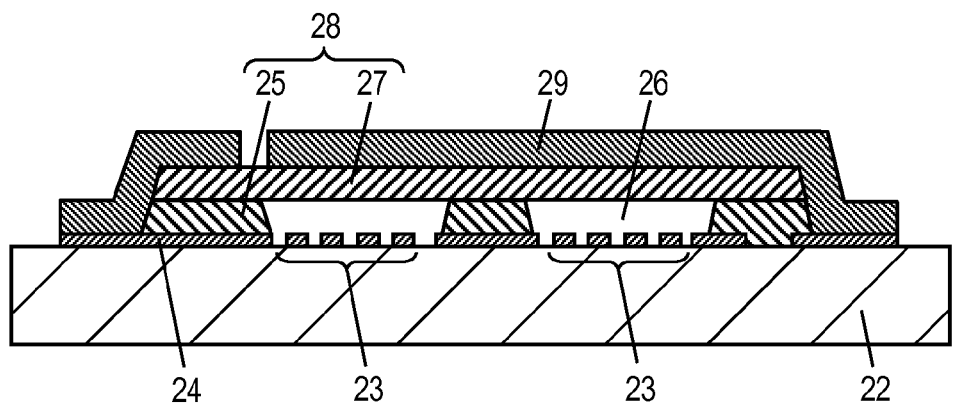
FIG. 3B is a cross sectional view of the elastic wave device according to the embodiment for illustrating the method of manufacturing the elastic wave device.

Then, plating resists 33 and 133 and the feeding conductor used for the electro-plating are removed, as shown in FIG. 3B.

Figure 3C:
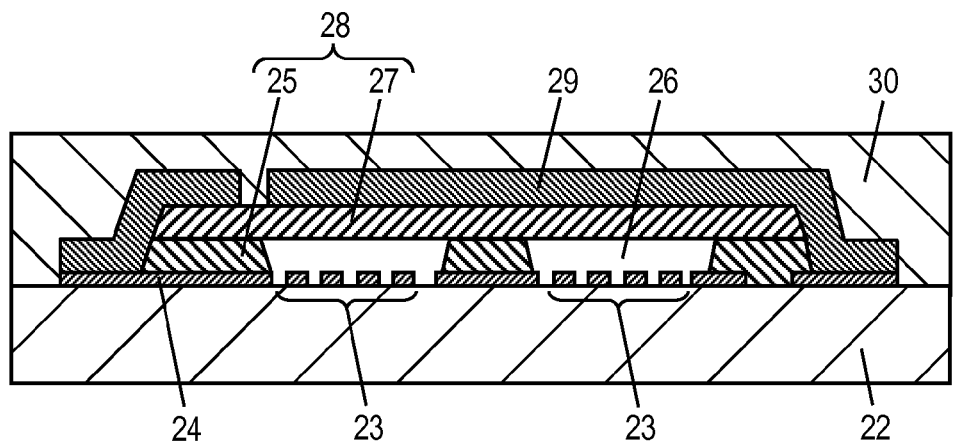
FIG. 3C is a cross sectional view of the elastic wave device according to the embodiment for illustrating the method of manufacturing the elastic wave device.

Then, a sheet made of epoxy-based resin containing a filler is placed and hardened to form sealing resin 30 covering element cover 28 and electrode 29, as shown in FIG. 3C.

Figure 4A:
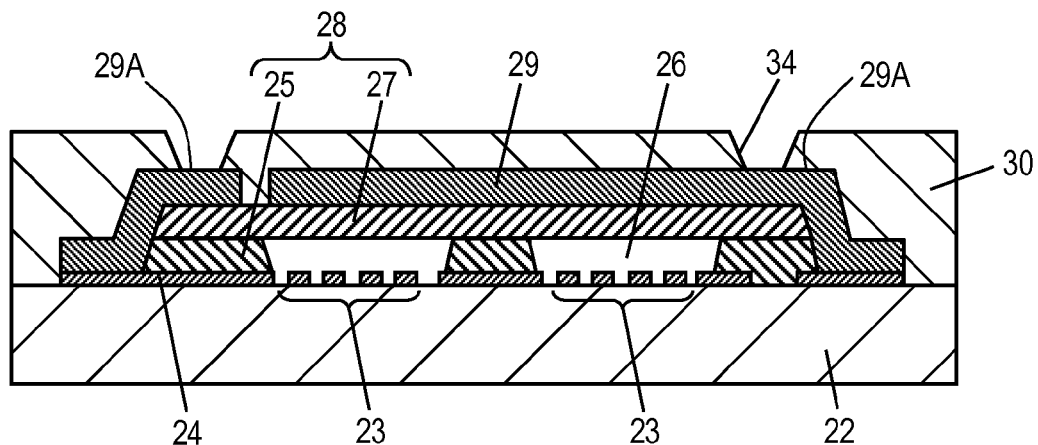
FIG. 4A is a cross sectional view of the elastic wave device according to the embodiment for illustrating the method of manufacturing the elastic wave device.

Next, as shown in FIG. 4A, opening 34 passing through sealing resin 30 to expose a part of upper surface 29A of electrode 29 is formed by laser cutting. Then, an inside surface of opening 34 and upper surface 30A of sealing resin 30 are desmeared and roughened with permanganic acid.

Figure 4B:
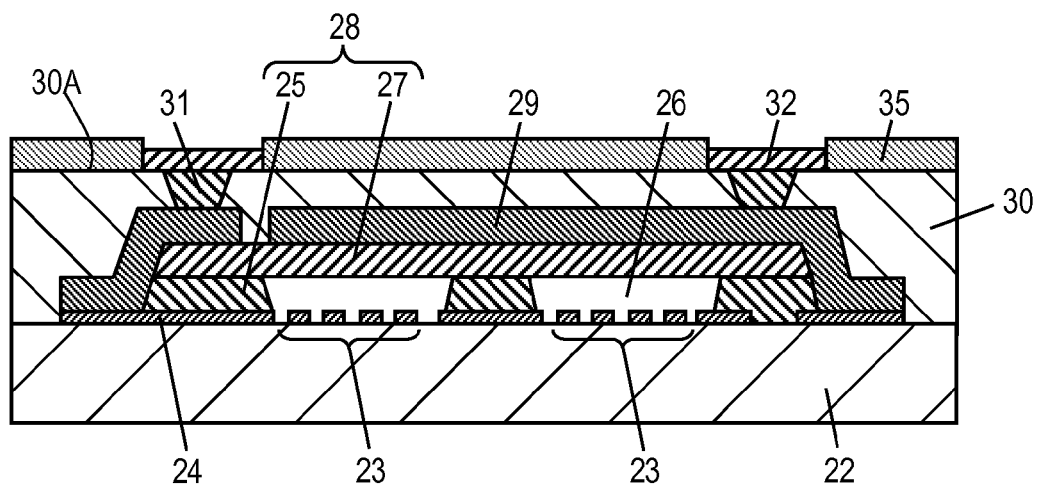
FIG. 4B is a cross sectional view of the elastic wave device according to the embodiment for illustrating the method of manufacturing the elastic wave device.

Then, a feeding conductor for electrolytic copper plating and plating resist 35 are formed on upper surface 30A of sealing resin 30. Electrode 31 and terminal electrode 32 filling opening 34 are formed by bright electrolytic copper plating, as shown in FIG. 4B.

Figure 4C:
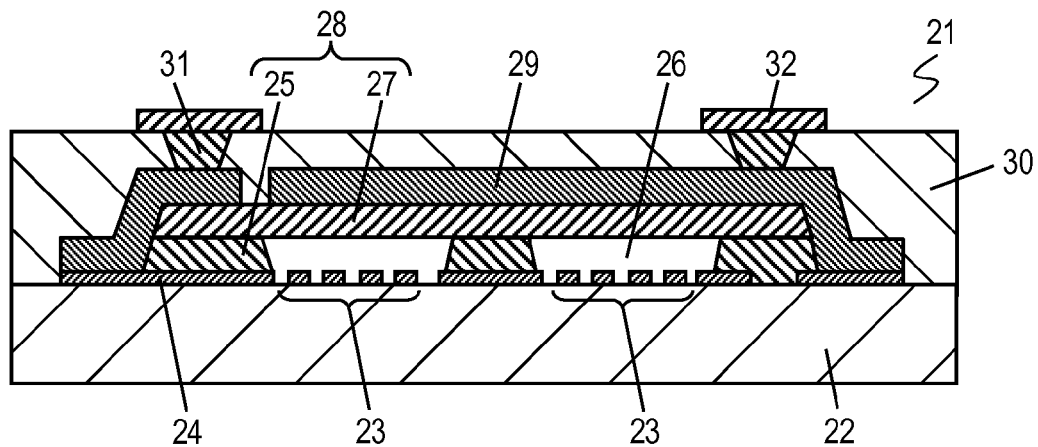
FIG. 4C is a cross sectional view of the elastic wave device according to the embodiment for illustrating the method of manufacturing the elastic wave device.

Finally, plating resist 35 and the feeding conductor for electrolytic copper plating are removed to provide elastic wave device 21, as shown in FIG. 4C.

As explained, in elastic wave device 21, electrode 29 is produced by matte electrolytic copper plating while electrode 31 is produced by bright copper electrolytic plating, thereby reducing warping and breaking of piezoelectric substrate 22.

According to the embodiment, terms, such as "upper surface" and "above", indicating directions indicate a relative direction depending on a relative positional relationship of constituent components, such as the piezoelectric substrate and the comb-shaped electrode, of the elastic wave device, and do not indicate absolute directions, such as a vertical direction.

INDUSTRIAL APPLICABILITY

An elastic wave device according to the present invention is useful for a high frequency filter, a splitter, a duplexer or the like to be used for a mobile communication device.

REFERENCE MARKS IN THE DRAWINGS

21 Elastic Wave Device
22 Piezoelectric Substrate
23 Comb-Shaped Electrode
24 Wiring
26 Space
28 Element Cover
29 Electrode (First Electrode)
30 Sealing Resin
31 Electrode (Second Electrode)
32 Terminal Electrode

The invention claimed is:

1. An elastic wave device comprising:
a piezoelectric substrate;
a comb-shaped electrode disposed above an upper surface of the piezoelectric substrate;
wiring connected to the comb-shaped electrode;
a cover disposed above the upper surface of the piezoelectric substrate, covering the comb-shaped electrode and defining a space between the upper surface of the piezoelectric substrate and the cover;
a first electrode disposed above an upper surface of the cover;
a sealing resin disposed above the upper surface of the piezoelectric substrate and covering the cover and the first electrode;
a terminal electrode disposed above an upper surface of the sealing resin; and
a second electrode passing through the sealing resin and electrically connecting the first electrode with the terminal electrode, the first electrode and the second electrode being made of a metal film produced by electro-plating, and a diameter of plating particles of the first electrode being larger than a diameter of plating particles of the second electrode.

2. An elastic wave device comprising:
a piezoelectric substrate;
a comb-shaped electrode disposed above an upper surface of the piezoelectric substrate;
wiring connected to the comb-shaped electrode;
a cover disposed above the upper surface of the piezoelectric substrate, covering the comb-shaped electrode and defining a space between the upper surface of the piezoelectric substrate and the cover;
a first electrode disposed above an upper surface of the cover;

a sealing resin disposed above the upper surface of the piezoelectric substrate and covering the cover and the first electrode;

a terminal electrode disposed above an upper surface of the sealing resin; and a second electrode passing through the sealing resin and electrically connecting the first electrode with the terminal electrode, a Young's modulus of the first electrode being smaller than a Young's modulus of the second electrode, the first electrode being formed by matte copper plating and the second electrode being formed by bright copper plating.

3. An elastic wave device comprising:

a piezoelectric substrate;

a comb-shaped electrode provided above an upper surface of the piezoelectric substrate;

wiring connected to the comb-shaped electrode;

a cover disposed above the upper surface of the piezoelectric substrate, covering the comb-shaped electrode and defining a space between the upper surface of the piezoelectric substrate and the cover;

a first electrode disposed above an upper surface of the cover;

a sealing resin disposed above the upper surface of the piezoelectric substrate and covering the cover and the first electrode;

a terminal electrode disposed above an upper surface of the sealing resin; and a second electrode passing through the sealing resin and electrically connecting the first electrode with the terminal electrode, the first electrode being made of a first metal film produced by matte copper plating, and the second electrode being made of a second metal film produced by bright copper plating.

4. An elastic wave device comprising:

a piezoelectric substrate;

a comb-shaped electrode disposed above an upper surface of the piezoelectric substrate;

wiring connected to the comb-shaped electrode;

a cover disposed above the upper surface of the piezoelectric substrate, covering the comb-shaped electrode and defining a space between the upper surface of the piezoelectric substrate and the cover;

a first electrode disposed above an upper surface of the cover;

a sealing resin disposed above the upper surface of the piezoelectric substrate and covering the cover and the first electrode;

a terminal electrode disposed above an upper surface of the sealing resin; and a second electrode passing through the sealing resin and electrically connecting the first electrode with the terminal electrode, an internal stress of the first electrode being a tensile stress, and an internal stress of the second electrode being a compressive stress.

5. A method of manufacturing an elastic wave device comprising:

forming a comb-shaped electrode and wiring on an upper surface of a piezoelectric substrate;

forming a cover above the upper surface of the piezoelectric substrate that covers the comb-shaped electrode and defines a space between the upper surface of the piezoelectric substrate and the cover;

forming a first electrode above an upper surface of the cover by matte electrolytic copper plating;

forming a sealing resin above the upper surface of the piezoelectric substrate, the sealing resin covering the cover and the first electrode;

forming an opening passing through the sealing resin and exposing the first electrode from the opening; and forming a second electrode filling the opening and a terminal electrode above an upper surface of the sealing resin by bright copper electrolytic plating.

6. The method of claim 5 wherein forming the second electrode includes forming the second electrode to have a smaller diameter of plating particles than a diameter of plating particles of the first electrode.

7. The method of claim 5 wherein forming the second electrode includes using a copper sulfate plating solution that includes an additive to control a diameter of plating particles in the second electrode.

8. The elastic wave device of claim 1 wherein a Young's modulus of the first electrode is smaller than a Young's modulus of the second electrode.

9. The elastic wave device of claim 8 wherein a density of the first electrode is less than a density of the second electrode.

10. The elastic wave device of claim 9 wherein the first electrode is formed by matte copper plating and the second electrode is formed by bright copper plating.

11. The elastic wave device of claim 10 wherein an internal stress of the first electrode is a tensile stress and an internal stress of the second electrode is a compressive stress.

12. The elastic wave device of claim 11 wherein the internal stress of the first electrode is smaller than the internal stress of the second electrode.

13. The elastic wave device of claim 12 wherein a conductivity of the second electrode is greater than a conductivity of the first electrode.

14. The elastic wave device of claim 13 wherein a surface of the first electrode is rougher than a surface of the second electrode.

15. The elastic wave device of claim 14 wherein the first electrode is softer than the second electrode.

16. The elastic wave device of claim 1 wherein a density of the first electrode is less than a density of the second electrode.

17. The elastic wave device of claim 1 wherein the first electrode is formed by matte copper plating and the second electrode is formed by bright copper plating.

18. The elastic wave device of claim 1 wherein an internal stress of the first electrode is a tensile stress and an internal stress of the second electrode is a compressive stress, and the internal stress of the first electrode is smaller than the internal stress of the second electrode.

19. The elastic wave device of claim 2 wherein a density of the first electrode is less than a density of the second electrode.

20. The elastic wave device of claim 3 wherein a density of the first electrode is less than a density of the second electrode.

21. The elastic wave device of claim 3 wherein an internal stress of the first electrode is a tensile stress and an internal stress of the second electrode is a compressive stress, and the internal stress of the first electrode is smaller than the internal stress of the second electrode.

22. The elastic wave device of claim 4 wherein the internal stress of the first electrode is smaller than the internal stress of the second electrode.

23. The elastic wave device of claim 22 wherein a density of the first electrode is less than a density of the second electrode.

24. An elastic wave device comprising:
- a piezoelectric substrate;
- a comb-shaped electrode disposed above an upper surface of the piezoelectric substrate;
- wiring connected to the comb-shaped electrode;
- a cover disposed above the upper surface of the piezoelectric substrate, covering the comb-shaped electrode and defining a space between the upper surface of the piezoelectric substrate and the cover;
- a first electrode disposed above an upper surface of the cover;
- a sealing resin disposed above the upper surface of the piezoelectric substrate and covering the cover and the first electrode;
- a terminal electrode disposed above an upper surface of the sealing resin; and
- a second electrode passing through the sealing resin and electrically connecting the first electrode with the terminal electrode, a Young's modulus of the first electrode being smaller than a Young's modulus of the second electrode, an internal stress of the first electrode being a tensile stress, an internal stress of the second electrode being a compressive stress, and the internal stress of the first electrode being smaller than the internal stress of the second electrode.

* * * * *